United States Patent [19]
Haroun et al.

[11] Patent Number: 6,038,536
[45] Date of Patent: Mar. 14, 2000

[54] DATA COMPRESSION USING BIT CHANGE STATISTICS

[75] Inventors: Baher S. Haroun, Allen; Suman Narayan, Dallas, both of Tex.

[73] Assignee: Texas Instruments Incorporated, Dallas, Tex.

[21] Appl. No.: 09/016,615

[22] Filed: Jan. 30, 1998

Related U.S. Application Data

[60] Provisional application No. 60/037,008, Jan. 31, 1997.

[51] Int. Cl.[7] .................................. G10L 5/02; G11B 5/00
[52] U.S. Cl. ........................... 704/500; 704/229; 704/501
[58] Field of Search ..................................... 704/500–504, 704/229, 224, 249, 205, 211, 206

[56] References Cited

U.S. PATENT DOCUMENTS

| | | | |
|---|---|---|---|
| 4,636,876 | 1/1987 | Schwartz | 704/500 |
| 4,922,537 | 5/1990 | Frederiksen | 704/501 |
| 5,276,714 | 1/1994 | Hori et al. | 704/500 |
| 5,682,248 | 10/1997 | Yoshida | 358/404 |

*Primary Examiner*—David R. Hudspeth
*Assistant Examiner*—Vijay B. Chawan
*Attorney, Agent, or Firm*—Warren L. Franz; Wade James Brady III; Richard L. Donaldson

[57] ABSTRACT

A method is provided for compressing relatively time invariant binary data, such as speech data in a telephone answering device, using statistical analysis of changes in the data. An original record organized into multiple frames of multiple bits each is used to construct an XORed record of the same number of frames and bits. The XORed record has a base frame with the same bit value pattern as a corresponding base frame of the original record, and remaining frames with bit values given by the outputs of an exclusive-OR operation applied to the bit values of corresponding and prior frames of the original record. The bit positions of the XORed record frame set are analyzed and reordered, according to their bit value change activity and used to construct an output record. The output record may have a base frame with the same bit value pattern as the corresponding reordered XORed record base frame. Other output record frames are established using a compression scheme wherein at least low bit value change subframes of the reordered XORed record frames are compressed by replacing them with shorter bit patterns having a format comprising a first part representing the number of bit changes occurring in the subframe and a second part identifying the location or locations, if any, of those changes. The foregoing procedure is reversed to restore the original record from the output record.

10 Claims, 6 Drawing Sheets

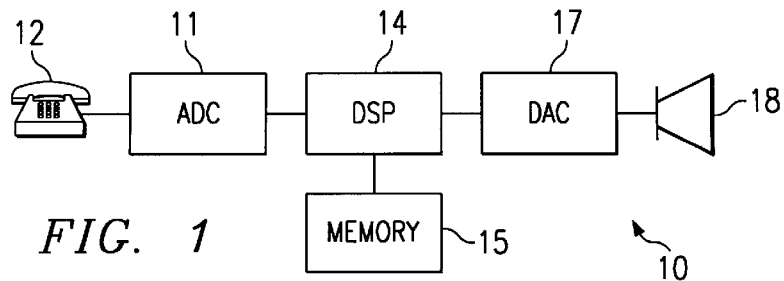
FIG. 1
FIG. 2
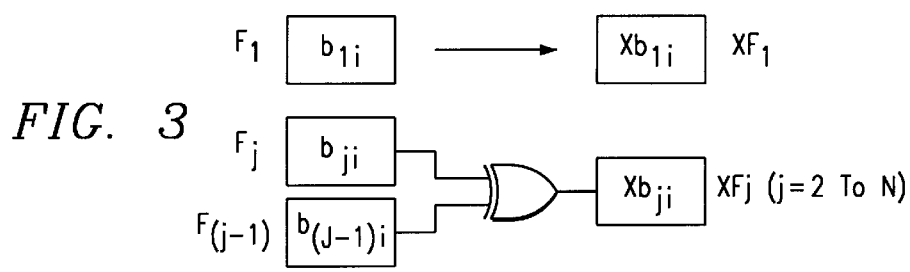
FIG. 3
FIG. 6
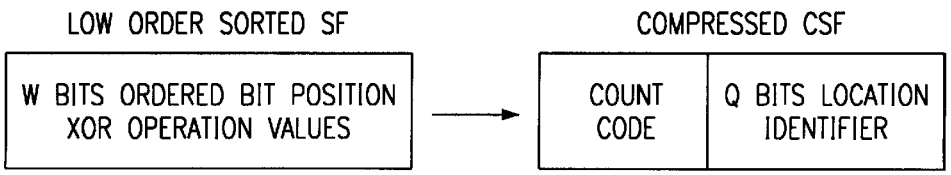

|      | Xb$_{11}$ | Xb$_{12}$ |     | Xb$_{1i}$ |     | Xb$_{1M}$ |
|------|-----------|-----------|-----|-----------|-----|-----------|
| XF$_1$ |           |           |     |           |     |           |
| XF$_2$ | Xb$_{21}$ | Xb$_{22}$ |     | Xb$_{2i}$ |     | Xb$_{2M}$ |
|      |           |           |     |           |     |           |
| XF$_j$ | Xb$_{j1}$ | Xb$_{j2}$ |     | Xb$_{ji}$ |     | Xb$_{jM}$ |
|      |           |           |     |           |     |           |
| XF$_N$ | Xb$_{N1}$ | Xb$_{N2}$ |     | Xb$_{Ni}$ |     | Xb$_{NM}$ |

| REORDERED XF$_1$ | Xb$_{1p_1}$ | Xb$_{1p_2}$ | Xb$_{1p_K}$ | Xb$_{1p_M}$ |
|---|---|---|---|---|
| REORDERED XF$_2$ | SF$_{12}$ | SF$_{22}$ | | SF$_{L2}$ |
| REORDERED XF$_j$ | SF$_{1j}$ | SF$_{2j}$ | | SF$_{Lj}$ |
| REORDERED XF$_N$ | SF$_{1N}$ | SF$_{2N}$ | | SF$_{LN}$ |

*FIG. 7*

| OF$_1$ | Xb$_{1p_1}$ | Xb$_{1p_2}$ | Xb$_{1p_K}$ | Xb$_{1p_M}$ |
|---|---|---|---|---|
| OF$_2$ | CSF$_{12}$ | CSF$_{22}$ | | SF$_{L2}$ |
| OF$_j$ | CSF$_{1j}$ | CSF$_{2j}$ | | SF$_{Lj}$ |
| OF$_N$ | CSF$_{1N}$ | CSF$_{2N}$ | | SF$_{LN}$ |

FIG. 10

$$\begin{array}{c} \\ F_1 \\ F_2 \\ F_3 \\ F_4 \\ F_5 \\ F_6 \\ F_7 \\ F_8 \end{array} \begin{array}{c} 1\ 2\ 3\ 4\ 5\ 6\ 7\ 8\ 9\ 10\ 11\ 12\ 13\ 14\ 15\ 16 \\ \left[\begin{array}{cccccccccccccccc} 1 & 0 & 1 & 0 & 1 & 0 & 1 & 1 & 1 & 1 & 1 & 0 & 0 & 1 & 1 & 1 \\ 0 & 0 & 1 & 0 & 0 & 0 & 1 & 1 & 0 & 1 & 1 & 0 & 0 & 1 & 0 & 1 \\ 0 & 0 & 1 & 1 & 1 & 0 & 1 & 1 & 0 & 1 & 0 & 0 & 1 & 1 & 0 & 0 \\ 0 & 0 & 1 & 1 & 1 & 0 & 1 & 0 & 0 & 1 & 0 & 0 & 1 & 1 & 0 & 0 \\ 0 & 0 & 1 & 1 & 1 & 0 & 1 & 1 & 0 & 0 & 1 & 0 & 1 & 1 & 0 & 0 \\ 0 & 0 & 1 & 0 & 1 & 1 & 1 & 1 & 0 & 0 & 1 & 0 & 1 & 0 & 1 & 0 \\ 1 & 0 & 1 & 0 & 1 & 0 & 1 & 1 & 0 & 0 & 1 & 1 & 1 & 1 & 0 & 1 \\ 1 & 0 & 1 & 0 & 1 & 0 & 1 & 1 & 0 & 0 & 1 & 1 & 1 & 1 & 1 & 1 \end{array}\right] \end{array}$$

FIG. 11

$$\begin{array}{c} \\ XF_1 \\ XF_2 \\ XF_3 \\ XF_4 \\ XF_5 \\ XF_6 \\ XF_7 \\ XF_8 \end{array} \begin{array}{c} 1\ 2\ 3\ 4\ 5\ 6\ 7\ 8\ 9\ 10\ 11\ 12\ 13\ 14\ 15\ 16 \\ \left[\begin{array}{cccccccccccccccc} 1 & 0 & 1 & 0 & 1 & 0 & 1 & 1 & 1 & 1 & 1 & 0 & 0 & 1 & 1 & 1 \\ 1 & 0 & 0 & 0 & 1 & 0 & 0 & 0 & 1 & 0 & 0 & 0 & 0 & 0 & 1 & 0 \\ 0 & 0 & 0 & 1 & 1 & 0 & 0 & 0 & 0 & 1 & 0 & 1 & 0 & 0 & 0 & 1 \\ 0 & 0 & 0 & 0 & 0 & 0 & 0 & 1 & 0 & 0 & 0 & 0 & 0 & 0 & 0 & 0 \\ 0 & 0 & 0 & 0 & 0 & 0 & 1 & 0 & 1 & 1 & 0 & 0 & 0 & 0 & 0 & 0 \\ 0 & 0 & 0 & 1 & 0 & 1 & 0 & 0 & 0 & 0 & 0 & 0 & 1 & 1 & 0 \\ 1 & 0 & 0 & 0 & 0 & 1 & 0 & 0 & 0 & 0 & 0 & 1 & 0 & 1 & 1 & 1 \\ 0 & 0 & 0 & 0 & 0 & 0 & 0 & 0 & 0 & 0 & 0 & 0 & 0 & 0 & 1 & 0 \end{array}\right] \end{array}$$

```
                    2  3  7 12 13  4  6  9 10  1  5  8 11 14 16 15
REORDERED XF₁    [  0  1  1  0  0  0  0  1  1  1  1  1  1  1  1  1 ]
SF₁₂, SF₂₂       [  0  0  0  0  0  0  0  1][ 0  1  1  0  0  0  0  1 ]
SF₁₃, SF₂₃       [  0  0  0  0  1  1  0  0][ 0  0  1  0  1  0  1  0 ]
SF₁₄, SF₂₄       [  0  0  0  0  0  0  0  0][ 0  0  0  1  0  0  0  0 ]
SF₁₅, SF₂₅       [  1  0  0  0  0  0  0  0][ 1  0  0  1  1  0  0  0 ]
SF₁₆, SF₂₆       [  0  0  0  0  0  1  1  0][ 0  0  0  0  0  1  0  1 ]
SF₁₇, SF₂₇       [  0  0  0  1  0  0  1  0][ 0  1  0  0  0  1  1  1 ]
SF₁₈, SF₂₈       [  0  0  0  0  0  0  0  0][ 0  0  0  0  0  0  0  1 ]
```

```
                                                            16 BITS
                                                               ↓
OF₁ (REORDERED XF₁)  [ 0  1  1  0  0  0  0  1  1  1  1  1  1  1  1  1 ]     0 (BASE)
OF₂ (CSF₁₂, SF₂₂)    [ 0  0  1  1  1][ 0  1  1  0  0  0  1 ]              -3
OF₃ (CSF₁₃, SF₂₃)    [ 1  0  0  0  0  1  1  0  0][ 0  0  1  0  1  0  1  0 ] +1
OF₄ (CSF₁₄, SF₂₄)    [ 0  0][ 0  0  0  1  0  0  0  1 ]                    -6
OF₅ (CSF₁₅, SF₂₅)    [ 0  1  0  0  0][ 1  0  0  1  1  0  0  0 ]           -3
OF₆ (CSF₁₆, SF₂₆)    [ 1  0  0  0  0  1  1  0][ 0  0  0  0  0  1  0  1 ]  +1
OF₇ (CSF₁₇, SF₂₇)    [ 1  0  0  0  1  0  0  1  0][ 0  1  0  0  0  1  1  1 ] +1
OF₈ (CSF₁₈, SF₂₈)    [ 0  0][ 0  0  0  0  0  0  0  1 ]                    -6
                                                                          ___
                                                                          -15
                                                                          ===
```

DATA COMPRESSION USING BIT CHANGE STATISTICS

This application claims priority under 35 U.S.C. §119(e)(1) of provisional application Ser. No. 60/037,008 filed Jan. 31, 1997, entitled "Data Compression Using Bit Change Statistics," the entirety of which is incorporated herein by reference.

This invention relates to methods for compressing data using statistical analysis of the data values. It is particularly useful for the compression of encoded speech data.

BACKGROUND OF THE INVENTION

There is an increased demand for ways to reduce the number of bits needed for transferring or storing data in binary digital form. This demand exists, for example, in the telecommunications industry for storing digitally encoded speech off-line into memory such as for telephone answering and recording purposes. One way to reduce needed memory capacity for binary digital data storage is through data compression. Data compression involves reformatting a binary representation of the data, using some defined encoding scheme to re-represent the same data in some new, abbreviated way, using fewer bits. A measure of the effectiveness of such compression is the accuracy and completeness with which the new compressed re-representation can be used to reproduce the original representation, when needed.

SUMMARY OF THE INVENTION

The invention provides a method for compressing a binary representation of data using statistical analysis of changes in the bit values of the data itself, to provide a new, abbreviated binary representation of the same data, from which the original representation can be completely reproduced, without any loss of information.

In accordance with the invention, compression is achieved by analyzing changes in the values of corresponding bit positions of successive frames of a binary digital data record, and representing the bit patterns of frames with few changes by shorter bit patterns identifying the number of changes and the bit locations of those changes.

In one aspect of the invention, the amount of compression is enhanced by reordering the bit positions according to numbers of changes for that bit position occurring in all frames of the statistical sample. In another aspect of the invention, the amount of compression is further enhanced by breaking the frames into subframes after reordering, with the compression analysis conducted on the subframes. In yet another aspect of the invention, the representations for the numbers of bit value changes in the compressed bit patterns are encoded using uniquely decipherable codes.

In one embodiment, described in greater detail below, the compression method is applied to a binary digital record organized into multiple frames of multiple bits each. The original record is used to construct an XORed record of the same number of frames and bits. The first frame of the XORed record is established as a base frame having the same bit value pattern as a corresponding first frame of the original record, and remaining frames of the XORed record are established as successive XORed frames having bit position values given by the outputs of an exclusive-OR operation applied to the values of like bit positions of corresponding and prior frames of the original record. The bit positions of the frames of the XORed record are analyzed to construct an activity vector A, which is sorted and used to derive an index R for reordering the bit positions of the XORed record, in ascending order, according to the number of bit value changes occurring for that bit location in all frames of the XORed record. The reordered XORed record is then used to construct an output record. The first frame of the output record is established as a base frame having the same bit value pattern as the reordered base frame of the XORed record. Other output record frames are established using a compression scheme wherein at least low bit value change subframes of frames of the XORed record are compressed by replacing them with shorter bit patterns having a format comprising a first part representing the number of bit changes occurring in the subframe and a second part identify the location or locations, if any, of those changes. The foregoing procedure is reversed to restore the original record from the output record.

The compression method of the invention finds application for compression of all data records that exhibit substantially unchanging bit position values from frame to frame, over short periods of time. It is particularly useful for the lossless compression (viz. further compression or "recompression") for off-line storage of speech records which have been encoded using linear predictive encoding techniques, such as CELP (Codebook Excited Linear Prediction) from the U.S. Department of Defense, MELP (Mixed Excitation Linear Predictive) encoding, the RPE-LTP coder of the European digital cellular mobile telephone system GSM, the VSELP coder of the corresponding American system ADC, as well as the VSELP coder of the pacific digital cellular system PDC. Experiments conducted with MELP-encoded samples have indicated lossless compression with memory capacity savings on the order of 15%.

BRIEF DESCRIPTION OF THE DRAWINGS

Embodiments of the invention have been chosen for purposes of illustration and description, and are shown with reference to the accompanying drawings wherein:

FIG. 1 is a block diagram of a digital signal processing system for an exemplary implementation of the data compression method of the invention;

FIGS. 2 through 7 are schematic diagrams helpfull in understanding the general principles of the compression method of the invention;

FIGS. 10 through 16 are schematic diagrams showing application of the method to specific bit values;

FIG. 17 is a representative histogram for typical data; and

DETAILED DESCRIPTION OF PREFERRED EMBODIMENTS

Figure 8:
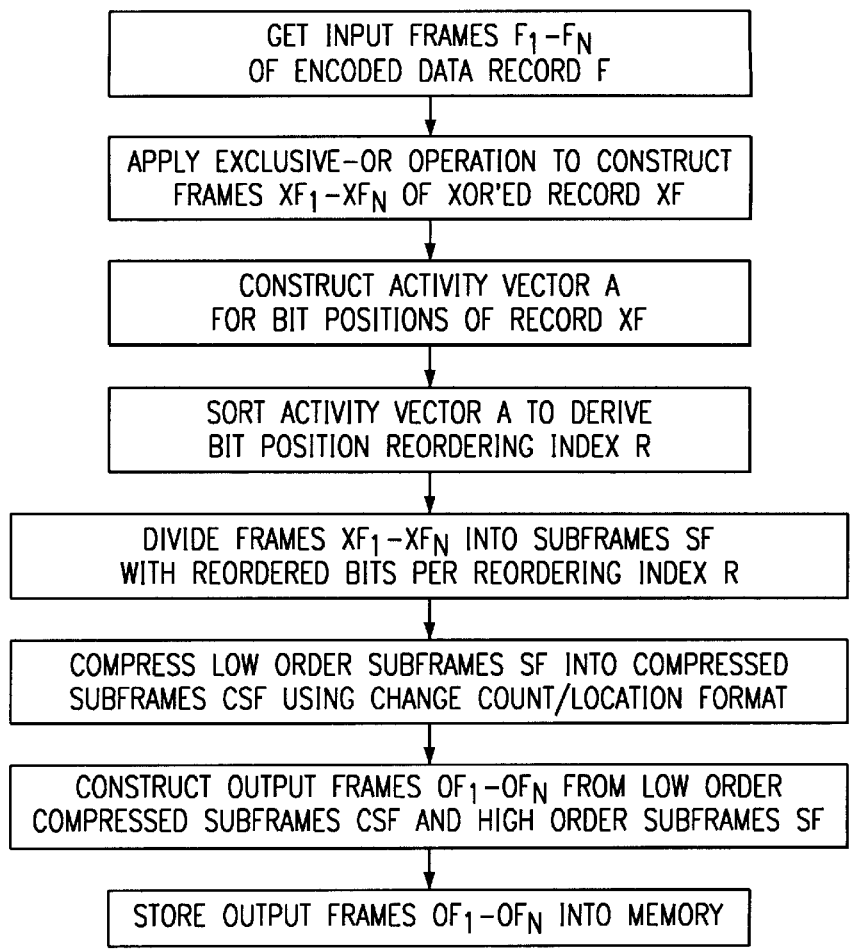
FIGS. 8 and 9 are process flow diagrams for the data compression and decompression processes.

An exemplary implementation of the method of the invention is described with reference to a digital telephone answering device 10 shown in FIG. 1. When device 10 answers an incoming call to record a message, analog-to-digital converter (ADC) 11 samples analog speech from a telephone handset 12 at a given sampling rate (e.g., 8 KHz), converts the analog samples to digital values, and supplies the digital values to a speech encoder, such as digital signal processor (DSP) 14. Encoder 14 encodes the supplied values according to a predefined data framing protocol and the resulting encoded bit stream is stored in a digital memory storage component 15. During play-back, the encoded bit stream is retrieved from memory 15 and supplied to a speech decoder which reverses the encoding process. The decoder may be the same digital signal processor 14 that does the encoding. Digital-to-Analog converter (DAC) 17 synthesizes analog speech from the speech decoder output for replay over speaker 18. A low-pass, anitaliasing filter (not shown) filters the analog speech signal input to analog-to-digital converter 11. A high-pass, second order biquad filter (not shown) filters the digitized samples from analog-to-digital converter 11. The high pass filter attenuates D.C. or hum contamination that may occur in the incoming speech signal. The compression method of the invention is implemented in conjunction with encoding and decoding, by additional processing performed by the digital signal processor 14 executing program statements.

Digital signal processor 14 first acts to encode sampled speech data according to a predefined data framing protocol to provide a speech data record F, shown in FIG. 2, which has a sequence of N consecutive frames $(F_1, F_2, \ldots, F_N)$ of M bits each, indexed with $b_{ji}$ corresponding to the $i^{th}$ bit of the $j^{th}$ frame. Thus, as shown in FIG. 2, the first (or "base") frame $F_1$ has M bits identified as $b_{11}$ through $b_{1M}$, the second frame $F_2$ has M bits identified as $b_{21}$ through $b_{2M}$, the $j^{th}$ frame $F_j$ has M bits identified as $b_{j1}$ through $b_{jM}$, and the $N^{th}$ frame $F_N$ has M bits identified as $b_{N1}$ through $b_{NM}$. In accordance with the invention, a method is provided to compress (viz. further compress or "recompress") the already encoded binary data record F of N×M bits, using the redundancy contained between successive frames and the statistical properties of the compressed speech record itself. Further in accordance with the invention, a method is provided to restore the original record from the compressed record, giving fill reproduction of the original, with no loss of information or degradation of quality.

Compression

As an initial step in the compression process, the compressed record F is used to construct an XORed (exclusive OR function) speech record XF having N consecutive frames $(XF_1, XF_2, \ldots, XF_N)$ of M bits each, indexed with $Xb_{ji}$ corresponding to the $i^{th}$ bit of the $j^{th}$ frame of the XORed record XF. As indicated schematically in FIG. 3, the M bits of the first frame $XF_1$ of the record XF are the same as the M bits of the base frame $F_1$ of the starting record F. The bits of the remaining frames $XF_2$ through $XF_N$ are obtained by applying the XOR binary function $\oplus$ to the bits of the corresponding frames $F_2$ through $F_N$ of the F record, to derive the $j_{th}$ frame $XF_j$ (for j=2 to N) of the XORed speech record XF, as follows:

$$XF_j = F_j \oplus F_{j-1} \text{ for } j=2 \text{ to } N. \tag{1}$$

Thus, as shown in FIG. 4, the bits of the XORed speech record XF are:

$$Xb_{1i} = b_{1i} \text{ for } i=1 \text{ to } M; \text{ and}$$

$$Xb_{ji} = b_{ji} \oplus b_{(j-1)i} \text{ for } j=2 \text{ to } N, i=1 \text{ to } M. \tag{2}$$

The value of the bits $Xb_{ji}$ indicate whether the $i^{th}$ bit of frame $F_j$ has "flipped" (i.e. changed state) from the previous frame $F_{j-1}$. For example, if the $i^{th}$ bit of frame $F_j$ is a "0" and the corresponding $i^{th}$ bit of frame $F_{j-1}$ is also a "0", the value of the $i^{th}$ bit of frame $XF_j$ will be a "0"; whereas if the $i^{th}$ bit of frame $F_j$ is a "1" and the corresponding $i^{th}$ bit of frame $F_{j-1}$ is a "0", the value of the $i^{th}$ bit of frame $XF_j$ will be a "1".

The next step is to construct an activity vector for each bit position i=1 to M of the XORed frame set XF. The purpose here is to acquire an indication of how many times each bit position i has flipped in going from one frame $F_j$ to the next successive frame $F_{j+1}$, through all the frames $XF_1$ through $XF_N$. This is done by accumulating M activity values $A_i$ for i=1 to M corresponding to each bit position of the M-bit frame structure, by adding the XF bits as follows:

$$A_i = \sum_{j=2}^{N} Xb_{ji} \text{ for } i = 1 \text{ to } M. \tag{3}$$

An activity array (or list) A is then constructed, formed of the ordered pairs $(A_i, i)$ corresponding to each bit position 1 through M:

$$A=[(A_1, 1), (A_2, 2), \ldots, (A_i, i), \ldots, (A_M, M)]. \tag{4}$$

The next step is to group the least active bits by sorting the activity array A in ascending priority order according to the first argument of the ordered pairs, to get a sorted array SA defined as:

$$SA=[S_1, S_2, S_3, \ldots, S_k, \ldots, S_M], \tag{5}$$

such that $$S_k=(A_{P_k}, P_k) \text{ for } k=1 \text{ to } M, \tag{6}$$

where $A_{pr} \leq A_{ps}$ for every r<s for all $1 \leq r, s \leq M$.

An index array R is then constructed from the sorted array SA, as follows:

$$R=[P_1, P_2, \ldots, P_k, \ldots, P_M]. \tag{7}$$

The index array R indicates that bit position $b_{pr}$ of the frames of speech record F flips the same amount or less (has less activity) than bit position $b_{ps}$ if r<s for all r, s between 1 and M, inclusively.

The next step is to obtain the output speech record (compressed record) OF by reordering the bits of the frames of the XORed frame record XF according to the index array R, dividing the frames into subframes, compressing the bit patterns of lower order ones of the subframes, and storing the resulting bits. The base frame $XF_1=F_1$ can be treated the same as the other frames, or simply by storing its unaltered or reordered bit pattern with no further compression as the first M bits of the output speech record $OF_1$. FIGS. 5 and 6 illustrate the case where the reordered bits of frame $XF_1$ are stored, without further compression, as the base frame of the output speech record $OF_1$. Each other frame $XF_j$ (j=2 to N) is divided into L subframes $SF_{tj}$ (see FIG. 6) of length $W_t$ for t=1 to L, where $W_t$ is the number of bits in each subframe $SF_{tj}$. The reordered frame $XF_1$ has M bits $Xb_{1P_k}$ for k=1 to M (where the $P_k$ is the bit position order taken from the index array R), and each subframe $SF_{tj}$ has $W_t$ bits, as follows:

$$SF_{tj}=[S_1^{tj}, \ldots, S_i^{tj}, \ldots, S_{w_t}^{tj}]; \tag{8}$$

with the bit values defined by $$s_i^{1j} = Xb_{jP_i} \text{ for } t = 1, \text{ and}$$

$$s_i^{tj} = Xb_{jP_{\left(1+\sum_{n=1}^{t-1} W_n\right)}} \text{ for } t = 2 \text{ to } L.$$

For each subframe $SF_{tj}$ for t=1 to L−1, $SF_{tj}$ is compressed using the bit-location compression scheme described below, to get a corresponding compressed sorted array subframe $CSF_{tj}$. $CSF_{tj}$ is then stored in consecutive bits of the output speech record OF as shown in FIG. 7. For a typical stored speech record, the number of bits in the compressed subframe $CSF_{tj}$ will on the average be less than the number of bits $W_t$ of the corresponding subframe $SF_{tj}$. The choice of which frames $XF_1$ to $XF_N$ to reorder and divide into subframes and which subframes $SF_{tj}$ to compress may, however, be varied to match the characteristics of the type of data involved and the degree to which compression can be achieved.

Bit-Location Compression Scheme

For typical compressed speech records, statistically, the first subframes $SF_{tj}$ for small t (1, 2, etc.) have very few, if any, bits that are "1". The compression scheme takes advantage of this and encodes the locations of the "1's" in the lower order subframes. For a small number of "1's" (0, 1, 2, etc.) occurring in a subframe, fewer bits will be needed on the average to show the number and placements of the non "0" bit locations than the total number of bits $W_t$ in the subframe, thereby resulting in compression.

Consider an example bit-location compression applied to a subframe SF of length $W_t$=16 bits as input and a compressed subframe CSF as output. For this example, subframe SF has 16 possible bit locations for a "1" appearing in subframe SF and each location is to be identified by a binary encoding of Q=4 bits per location, [0000] for 1st position through [1111] for 16th position. First, the number count C of "1's" in the subframe SF is determined. If there are no "1's", C=0 and no bit locations need be identified. Thus, using a two-bit binary indication for "1" bit number count, the compressed subframe is CSF=[00], with two bits used for the binary representation of the number of "1's" (00=no "1's") and no bits needed to show the locations of any "1" positions. If there is one "1", the number count C=1 and the compressed subframe CSF=[$01x_1x_2x_3x_4$] is six bits long (a 10-bit savings); with [01] being the binary indication for one "1", and [$x_1x_2x_3x_4$] being the four-bit binary encoding, going from left to right in subframe SF, of the single "1" location in the 16-bit long subframe SF. If there are two "1's", C=2 and CSF=[$10x_1x_2x_3x_4y_1y_2y_3y_4$] is 10 bits long (a six-bit savings), with [10] indicating two "1's", [$x_1x_2x_3x_4$] being the four-bit binary encoding of the first "1" location, and [$y_1y_2y_3y_4$] being the binary encoding of the second "1" location. For this example, the encoding scheme has been chosen so that, if there are more than two "1's" in the subframe, location information is not used and the actual bit values are shown. Thus, where there are three or more "1's", C>2 is indicated by [11], and CSF=[$11s_1s_2 \ldots s_{16}$], where $s_1$ through $s_{16}$ are the pass-through bit values of the subframe SF. Here, the frame CSF is 18 bits long (a two-bit deficit).

A generalization of this scheme has two variations: Case 1 for a subframe of width (number of bits) W, where $2^Q-1<W \leq 2^Q$ so that binary encoding is available in Q bits to directly uniquely identify each possible bit location 1 through W (e.g., four bits are used to identify "1"locations in a 16-bit subframe), and Case 2 for a subframe of width W, where $W=2^Q+I$ for I=1, 2, etc. for which the bit location bits are insufficient for direct unique identification of identify all possible locations (e.g., four bits are used to identify "1"locations in a 20-bit subframe).

Case 1:

Let $SF=[s_0 s_1 \ldots s_{2^Q-1}]$ be a subframe which is $2^Q$ bits long. First, the count number C of "1's" in subframe SF is determined. If C=0, then the output compressed subframe CSF=[00]. If C=1, then CSF=[$01x_1x_2 \ldots x_Q$], where [$x_1x_2 \ldots x_Q$] is the encoded location of the single "1" bit position in SF (i.e., index of the bit $s_i$=1,i). If C=2, then CSF=[$10x_1x_2 \ldots x_Q y_1 y_2 \ldots y_Q$], where [$x_1x_2 \ldots x_3x_Q$] and [$y_1y_2 \ldots y_Q$] are the respective four-bit encoded locations of the first and second "1" bit positions in SF. If C>2, then CSF=[$11s_0 s_1 \ldots s_{2^Q-1}$].

Case 2:

Let $SF=[s_0 s_1 \ldots s_{2^Q+I-1}]$, where I is a small integer 1, 2, ..., $2^{Q-1}$ determined from the statistics of the compression and histogram of the count C. First, the count number C of "1's" in subframe SF is determined. Then, if C=0, the output CSF=[00]. If $s_0=s_1=s_{I-1}=0$ and C=1, then CSF=[$01x_1 \ldots x_Q$], where [$x_1 \ldots x_Q$] is the location of the first "1" in bits [$s_I \ldots s_{2^Q+I-1}$] where location=i-I if $s_i$=1. If C=2 and Loc1–Loc2<$2^Q$ and Loc2>I, where Loc1 is the location of the first "1" and Loc2 is the location of the second "1" in the subframe SF, then xLoc2=($2^Q$+I-1)–Loc2; dloc=Loc2–Loc1; and then CSF=[$10x_1 \ldots x_Q y_1 \ldots y_Q$] where [$x_1 \ldots x_Q$] is the Q-bit encoding of xLoc2 and [$y_1 \ldots y_Q$] is the encoding of dloc. For C>2, CSF=[$11s_0 \ldots s_{2^Q+I-1}$].

EXAMPLE

Consider an encoding scheme for the case of, for example, Q=4, I=4, with up to three "1" bits encoding:

$$W=2^Q+I, SF=[s_0 \ldots s_{W-1}].$$

Let C be the number of "1's" in the subframe SF; and let Loci be the location of the $S_i^{th}$ bit that is equal to "1" in subframe SF. Going from left to right; e.g., for Q=4, I=4 in a 20-bit sample [0001 0000 0001 0100 0000], there are three "1's" respectively located at the $s_3, s_{11}$, and $s_{13}$ bit locations. So, C=3 and Loc1=3, Loc2=11, and Loc3=13. Consider, also, instead of a straight (e.g., C=0, $E_0$=[00]; C=1, $E_1$=[01]; C=2, $E_2$=[10]; and C=3, $E_3$=[11]) encoding of the count number C, a different, uniquely decipherable (going from left to right) variable bit-length encoding scheme, such as C=0, $E_0$=[0001]; C=1, $E_1$=[01]; C=2, $E_2$=[001]; and C=3, $E_2$=[0000] and, for all uncompressed instances, $E_4$=[1];. Given the subframe SF, encoding can then be done, for example, according to the following rules:

If C=0, CSF=[0001]; where [0001]=$E_0$.

If C=1 and Loc1$\geq$I, then CSF=[$01x_1 \ldots x_Q$]; where, e.g., [01]=$E_1$ and where [$x_1 \ldots x_Q$] is the binary encoding of Loc1.

If C=2, Loc2–Loc1$\leq 2^Q$, Loc2$\geq I_j$; then CSF=[$001x_1 \ldots x_Q y_1 \ldots y_Q$]; where [001]=$E_2$, xLoc=W-1-Loc2 with [$x_1 \ldots x_Q$] being the binary encoding of xLoc; and yLoc=Loc2-Loc1-1 with [$y_1 \ldots y_Q$] being the binary encoding of yLoc.

If C=3, Loc3-Loc2$\leq 2^Q$, Loc2-Loc1$\leq Q$, and Loc3$\geq I_j$; then CSF=[$0000x_1 \ldots x_Q y_1 \ldots y_Q z_1 \ldots z_Q$]; where [0000]=$E_3$, [$x_1 \ldots x_Q$] is the binary encoding of xLoc=W-1-Loc3, [$y_1 \ldots y_Q$] is the binary encoding of yLoc=Loc3-Loc2-1, and [$z_1 \ldots z_Q$] is the binary encoding of zLoc=Loc2-Loc1-1.

For all other cases, if none of the above conditions is satisfied, then CSF=[$1s_0 \ldots s_{W-1}$]; where [1]=$E_4$.

The number count encoding is preferably chosen, as done above for $E_0$ through $E_4$, using a set of uniquely decipherable codes. The exemplary series 0001, 01, 001, 0000 and 1 meet this criterion by providing unambiguous deciphering in detecting the first "1" moving from left to right. A "1" in the first bit position immediately and unambiguously identifies $E_4$; a "1" in the second position, $E_1$; a "1" in the third position, $E_2$; a "1" in the fourth position, $E_0$; and the absence of a "1" after four bit positions, $E_3$. Those skilled in the art to which the invention relates will appreciate that the particular number count encoding scheme can be varied, and that other number location identification schemes are also possible.

Figure 9:
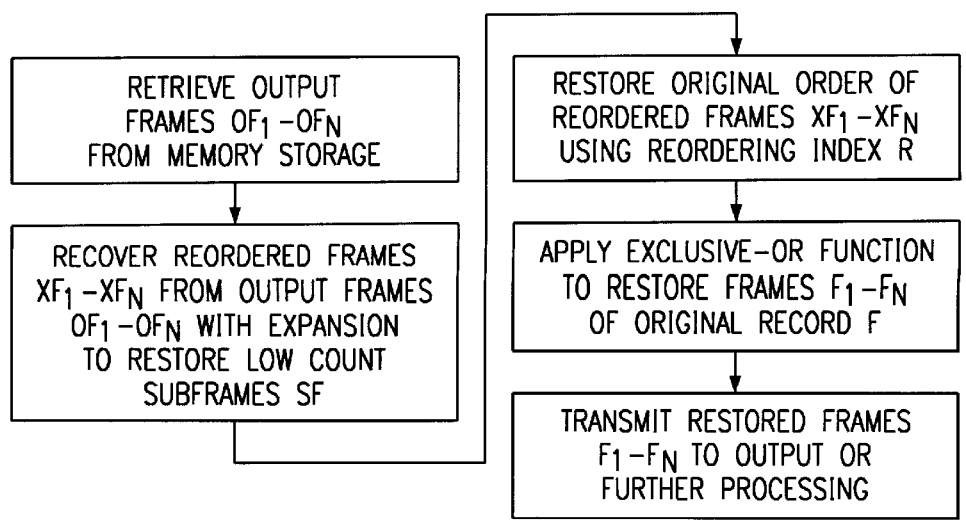

FIG. 8 summarizes the flow of steps in the compression procedure of the described data compression method. The procedure flow for recovering the original record F from the compressed record OF is shown in FIG. 9. The output frames $OF_1$ through $OF_N$ are retrieved; all compressed CSF subframes are expanded to their uncompressed SF counterparts; the original ordered XF frame is then reconstructed from the restored SF record, using the index array R to reorder the bit positions; and, finally, the original F record is recovered by applying the same exclusive-OR operation on the XF record that was performed on the F record to obtain the XF record in the first place, i.e. F1=XF1 and $F_j = XF_j \oplus XF_{j-1}$ for j=2 to N.

Figures 15, 16, 17:
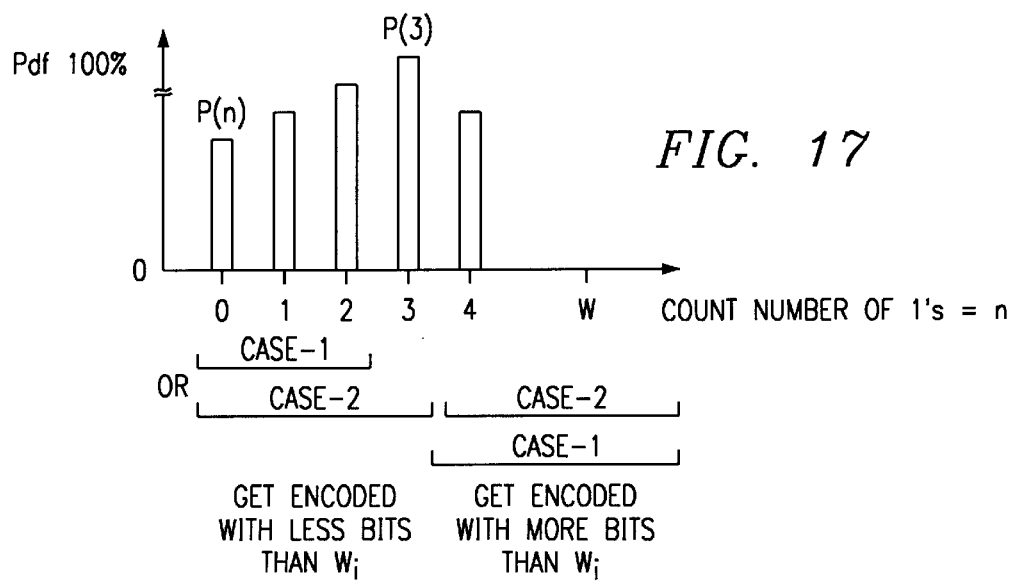
Figure 18:
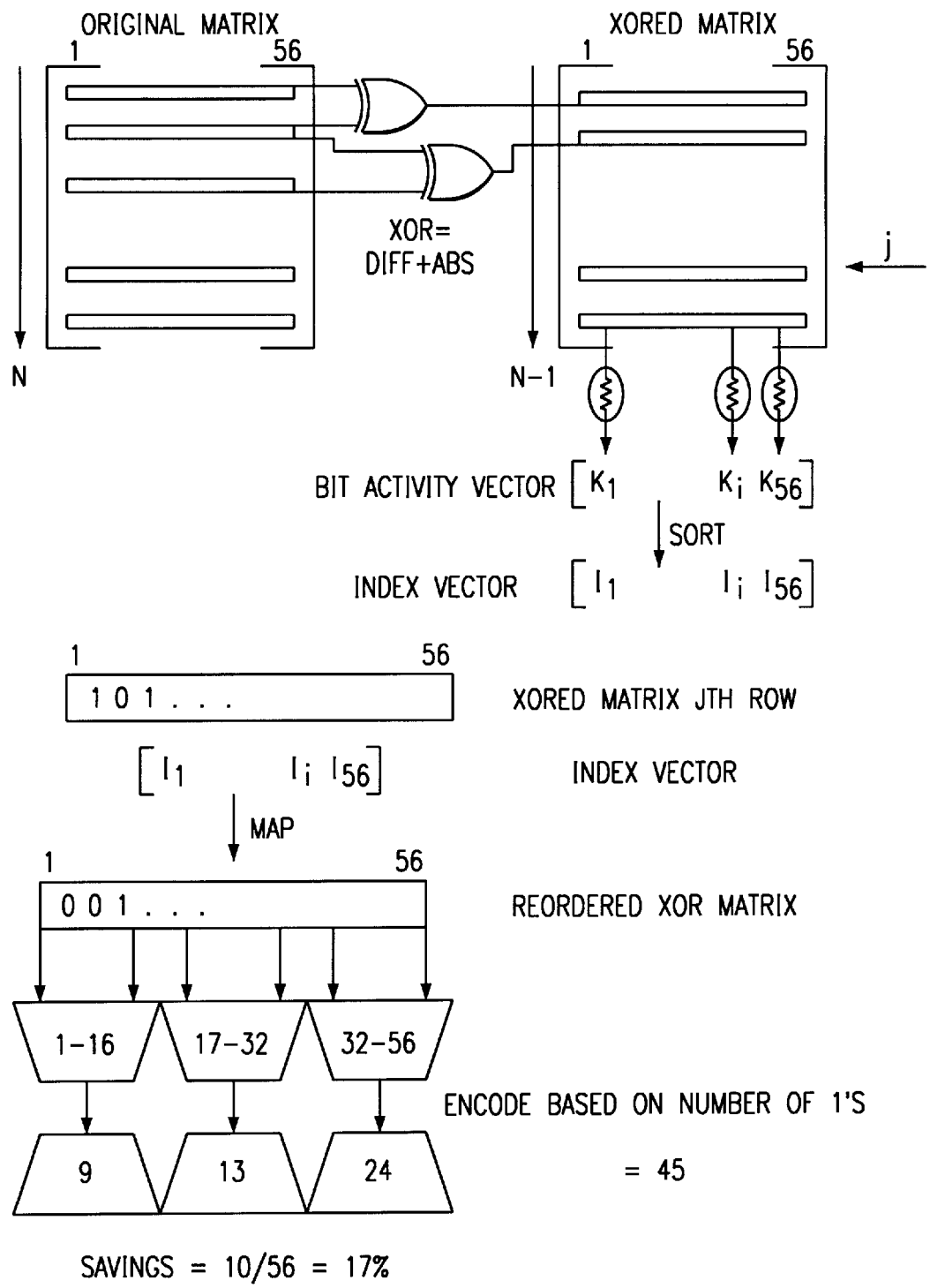
FIG. 18 is a schematic portrayal of the process flow of FIG. 8.

FIGS. 10 through 16 show the application of the procedure flow of FIG. 8 to achieve compression of a record F having eight frames $F_1$ through $F_8$ of 16-bits each. The starting bit positions are indicated as 1 through 16 in FIG. 10. To get corresponding XORed frames $XF_1$ through $XF_8$, the 16 bits of frame $F_1$ are used as the 16 bits of the frame $XF_1$ and the XOR operation is applied to corresponding bits of the frames and prior frames for $F_2$ through $F_8$ to construct the frames $XF_2$ through $XF_8$. Activity vector A is then constructed by examination of the value change activity of each bit position 1 through 16. For implementations which divide the base frame $XF_1$ into subframes SF and apply compression to those subframes, the "1's" in the base frame should be counted as flips. However, where, as here, the bit values of the base frame will be transferred directly to the output record base frame without compression, the occurrences of "1" in the base frame can be counted, or not. The activity vector A in FIG. 12 was derived counting the base frame $XF_1$ "1's" as "flips." Next, the array A is sorted by ascending number of "flips," into the sorted array SA shown in FIG. 13. The bit locations of the bit positions in the sorted array are then used to construct the reordering index R of FIG. 14. (For clarity, the numbers in FIGS. 12–14 are given as decimals, though it is understood that the actual implementations will use corresponding binary representations.) FIG. 15 shows the reordered frames $XF_1$ through $XF_8$, still each with 16 bits; however, with the bit patterns reordered according to the priorities established by the index R of FIG. 14. The reordered frame $XF_1$ is not divided into subframes. The reordered frames $XF_2$ through $XF_8$ are divided into two eight-bit subframes $SF_{1j}$ and $SF_{2j}$ each. The output record OF is then constructed with output frame $OF_1$ defined by the 16-bit pattern of reordered frame $XF_1$ and the remaining frames $OF_2$ through $OF_8$ are established by applying a bit-location compression scheme to the first subframes $SF_{1j}$ but not to the second subframes $SF_{2j}$. The compression is shown in FIG. 16 for a uniquely decipherable number count encoding scheme of C=0, $E_0$=[00]; C=1, $E_1$=[01]; and C≧2, $E_2$=[1]; and a sequential three-bit location identification scheme to identify the eight bit locations as [000] through [111]. The results of applying the compression are shown in FIG. 16. The bit savings is 15 bits over a total sample of 128 bits, chosen randomly but with some short term constancy from frame to frame. The savings for similar statistical compressions applied to much larger encoded speech records, having many more frames and much longer bit streams per frame, is expected to be even better.

Determining the values of $W_i$:

A reasoned approach can be taken in deciding what parameters are appropriate. Given a number of speech frame/records representative of an application such as the shown digital telephone answering device, for instance, for each of those records, the maximum number of subframes SF can be chosen to be L=M/Wmin, where Wmin is typically 8. For example, if M=56, L=7, and Wmin=8, then, for all subframes of width $W_i \in [8, 16, 20, 24, 32]$ that start at bit $s_i$ of the frame $XF_j$, where i=p*8 for p=0, 1,etc., the histogram (pdf or probability distribution finction) is obtained of the count C of the number of "1's" in each subframe of width $W_i$. A typical pdf may look something like that shown in FIG. 17. Selecting $E_0$–$E_4$ depends on the pdf of each subframe. Different selections of E's will generate different numbers of bits for each case or value of C. Different encodings can be tried based on the shape of the pdf. Shorter codes are assigned higher $P_{(n)}$.

Given the illustrated pdf, and for the two encoding schemes Case 1 and Case 2, above, the number of bits (nb) used to encode each count is known, as follows:

Case 1 (Q=4, W=16):

For C=0 and $E_0$=[00], CSF=[00], and the number of encoding bits nb(0)=2 (which represents 14 fewer bits than in the original).

For C=1 and $E_1$=[01], CSF=[01$x_1 x_2 x_3 x_4$] and nb(1)=6 (10 fewer bits).

For C=2 and $E_2$=[10], CSF=[10$x_1 x_2 x_3 x_4 y_1 y_2 y_3 y_4$] and nb(2)=10 (6 fewer bits).

And, for C≧3 and $E_3$[11], CSF=[11$s_0 \ldots s_{15}$] and nb(3)=18 (2 more bits).

Case 2 (Q=4, I=4, W=20):

For C=0 and $E_0$=[0001], CSF=[0001], and the number of encoding bits nb(0)=4 (which represents 16 fewer bits than in the original).

For C=1 and $E_1$=[01], CSF=[01$x_1 x_2 x_3 x_4$] and nb(1)=6 (14 fewer bits).

For C=2 and $E_2$=[001], CSF=[001$x_1 x_2 x_3 x_4 y_1 y_2 y_3 y_4$] and nb(2)=11 (9 fewer bits).

For C=3 and $E_3$=[0000], CSF=[0000$x_1 x_2 x_3 x_4 y_1 y_2 y_3 y_4 z_1 z_2 z_3 z_4$] and nb(3)=16 (4 fewer bits).

And, for C>3 and $E_4$=[1], CSF=[1$s_0 \ldots s_{19}$] and nb(4)=21 (1 more bit). For each encoding scheme, $W_{\mathit{eff}}$ is then calculated:

$$\text{For Case 1: } W_{\mathit{eff}} = \sum_{n=0}^{2} P(n) nb(n) + \left( \sum_{n=3}^{W_i} P(n) \right) \times nb(3)$$

$$\text{For Case 2: } W_{\mathit{eff}} = \sum_{n=0}^{3} P(n) nb(n) + \left( \sum_{n=4}^{W_i} P(n) \right) \times nb(4)$$

where nb(n) is the number of bits used to encode a subframe.

For all subframes and for each encoding scheme, $W_{\mathit{eff}_{average}}$ is then found. For all combinations of subframes, such that $$\sum_{i=0}^{L-1} W_i = M$$

and all bits are covered, the total $$W_{\mathit{eff}_{average}}^{Tot} = \sum_{i=0}^{L-1} W_{\mathit{eff} i}$$

is then determined. This process is repeated for all speech records, and the combination of subframes that results in the minimum $W_{\mathit{eff}_{average}}^{Tot}$ average is selected for encoding.

Experiments

Experiments were conducted with MELP encoded speech records using five representative speech records having M=56 bits per frame, varying the number of frames per record used in gathering statistics, from N=100 to N=1088. The top two combinations were $W_0=16$, $W_1=16$, $W_{2-5}=0$ and $W_6=24$, with $W_{\mathit{eff}}^{Tot}=47.7$ and encoding Case 1, above, used for $W_0$ and $W_1$ and none for $W_6$; and $W_0=16$, $W_1=20$, $W_{2-5}=0$ and $W_6=20$ with $W_{\mathit{eff}}^{Tot}=47.2$ and encoding $W_0$ with Case 1, above, and Case 2, above, and $W_6$ with no encoding. Simulations carried out in MATLAB© indicated about 15% savings in storage requirement. This means that the amount of required memory can be reduced or additional speech time can be stored in the same amount of memory.

Particularly for off-line storage, the recompression scheme can be run when the processor is in an idle mode. The overhead for the demonstrated recompression mechanism was only one frame of speech and one index vector for each 112 bits of conventional speech storage. The additional memory overhead to store the copy of speech before compressing can be cut by using the segmented approach presented above. This also gives better savings. The specific implementation discussed above, by way of example, is a very basic encoding procedure, and it will be appreciated that modifications are possible which may produce even greater savings.

What is claimed is:

1. A method of compressing a binary digital signal, comprising the steps of:

providing a binary digital signal organized as a record F having a plurality of N consecutive frames of M bits each;

constructing a record XF from the record F, the record XF having N consecutive frames of M bits each, the M bits of a first frame $XF_1$ of the record XF being the same as the M bits of a base frame $F_1$ of the record F, and the M bits of subsequent frames $XF_j$ (j=2 to N) of the record XF being obtained by applying the XOR binary function to corresponding bit positions of a corresponding frame $F_j$ and a prior frame $F_{j-1}$ of the record F;

constructing an activity vector A for each bit position i=1 through M of the frames of the record XF, the vector A having M ordered pairs of the form $(A_i, i)$ (i=1 to M), where $A_i$ represents the sum of the logic "1's" for the bit position i in the frames $XF_1$ through $XF_N$ and i represents the bit position i;

constructing an index array vector R having M bits respectively corresponding to the bit position representations i of the ordered pairs of the activity vector A with the ordered pairs sorted into ascending order according to the values of the arguments $A_i$;

shifting the relative bit positions of the frames of the record XF according to the bit position ordering represented in the index array vector R; and constructing an output record OF from the shifted bit position record XF, the record OF having N consecutive frames $OF_k$ (k=1 through N), a first frame $OF_1$ of the record OF having M bits which are the same as the M bits of the shifted frame $XF_1$ of the record XF, at least one frame $OF_k$ (k between 2 and N) having fewer than M bits and including at least one bit representing the number of logic "1's" in bit positions 1 through L of the at least one frame $OF_k$ and at least one bit representing the bit position of the logic "1's" in bit positions 1 through L of the at least one other frame $OF_k$, and other frames $OF_k$ (k between 2 and N) having a format like that of the at least one frame $OF_k$ or having a format having M bits corresponding to the reordered bits of the corresponding frame of the XF.

2. A method of compressing and subsequently recovering a binary digital data record, comprising the method of claim 1, followed by restoration of the original binary data record F record from the output record OF.

3. The method of claim 2, further comprising deriving the original record F as an encoded bit stream from a speech encoder of a telephone answering device incident to message recording; and delivering the restored original record F to the speech decoder for decoding the bit stream incident to message playback.

4. A method of compressing a binary digital data record organized into multiple frames of multiple bits each, comprising the steps of:

providing a binary digital data record F having N frames $F_j$ (j=1 through N) of M bits each;

from the record F, constructing a record XF of the same number N of frames $XF_j$ (j=1 through N) of M bits each; a base frame of record XF being established with the same bit value pattern as a corresponding base frame of the record F, and remaining frames of record XF being established with bit value patterns obtained by applying an exclusive-OR operation to the values of like bit positions of corresponding frames and other frames of record F;

reordering the bits of frames $XF_j$ to group at least some of the bits of the record XF frame set according to the bit value change activity of the respective bit positions of frames $XF_j$ of the record XF; and from the reordered record XF, constructing an output record OF of the same number N of frames $OF_j$ (j=1 through N) from the reordered frames $XF_j$ of record XF; at least some of the frames $OF_j$ of the output record OF being established using a compression scheme wherein at least some bit patterns of lower bit value change activity groupings of frames $XF_j$ of the reordered record XF are compressed by replacing them with shorter bit patterns.

5. The method of claim 4, wherein in the at least some frames of the output record OF, the at least some bit patterns of the lower bit value change activity groupings are compressed by replacing them with shorter bit patterns having a format comprising a first part representing the number of bit changes occurring in the at least some bit patterns of the corresponding activity grouping and a second part identifying the location or locations, if any, of those changes.

6. A method of compressing speech in a telephone answering device, comprising the steps of:

encoding sampled speech data to provide a speech data record F having a sequence of N frames $F_j$ (j=1 through N) of M bits each;

from the record F, constructing a speech data record XF having N frames $XF_j$ (j=1 through N) of M bits each; frame $XF_1$ of record XF having the same bit sequence and values as corresponding frame $F_1$ of record F, and remaining frames $XF_j$ (j=2 through N) of record XF having bit sequences and values obtained by applying the XOR binary function to the corresponding bits of frames $F_j$ and $F_{j-1}$ (j=2 through N) of record F;

reordering the bits of frames $XF_j$ to group at least some of the bits of the record XF frame set according to the bit value change activity of the respective bit positions of frames $XF_j$;

from the reordered record XF, constructing a speech data record OF, having N consecutive frames $OF_j$ (j=1 through N) derived from corresponding reordered frames $XF_j$ (j=1 through N), with at least some of the frames $OF_j$ derived by compressing bits of lower bit value change activity groupings of the corresponding reordered frame $XF_j$ using a bit-location compression scheme.

7. The method of claim 6, wherein the step of reordering frames $XF_j$ comprises constructing an activity vector having activity values $A_i$ (i=1 through M) corresponding to the sum of the bits of the respective bit positions i=1 through M of the frames $X_j$ (j=1 through N) of the XF record.

8. The method of claim 7, wherein the step of reordering frames $XF_j$ further comprises constructing an activity array A, formed of the ordered pairs $(A_i, i)$ corresponding to each bit position 1 through M; sorting the activity array A in priority order according to the first argument of the ordered pairs to get a sorted array; and constructing an index array that indexes the bit positions of the record XF frame set in order of bit value change activity.

9. A method of compressing and subsequently recovering speech in a telephone answering device, comprising the method of compressing speech of claim 8 and further including restoring the original speech data record F, comprising the steps of:

retrieving the speech data record OF;

recovering the reordered record XF by expanding compressed bits of lower bit value change activity groupings of the at least some frames $OF_j$ to derive the uncompressed corresponding reordered frames $XF_j$;

recovering the original unreordered record XF from the reordered record XF using the index array; and recovering the original record F from the unreordered record XF, frame $F_1$ of record F being given the same bit sequence and values as corresponding frame $XF_1$ of the unreordered record XF, and other frames $XF_j$ (j=2 through N) being given bit sequences and values obtained by applying the XOR binary function to the corresponding bits of frames $XF_j$ and $XF_{j-1}$ (j=2 through N) of the recovered unreordered record XF.

10. The method of compressing and subsequently recovering speech in a telephone answering device, comprising the method of compressing speech of claim 6 and further including restoring the original speech data record F, comprising the steps of:

retrieving the speech data record OF;

recovering the reordered record XF by expanding compressed bits of lower bit value change activity groupings of the at least some frames $OF_j$ to derive the uncompressed corresponding reordered frames $XF_j$;

recovering the original unreordered record XF from the reordered record XF; and recovering the original record F from the unreordered record XF, frame $F_1$ of record F being given the same bit sequence and values as corresponding frame $XF_1$ of the unreordered record XF, and other frames $XF_j$ (j=2 through N) being given bit sequences and values obtained by applying the XOR binary function to the corresponding bits of frames $XF_j$ and $XF_{j-1}$ (j=2 through N) of the recovered unreordered record XF.

* * * * *